United States Patent
Kuan et al.

(10) Patent No.: US 10,374,617 B2
(45) Date of Patent: Aug. 6, 2019

(54) INJECTION-LOCKED DIGITAL BANG-BANG PHASE-LOCKED LOOP WITH TIMING CALIBRATION

(71) Applicant: Taiwan Semiconductor Manufacturing Company, Ltd., Hsinchu (TW)

(72) Inventors: Ting-Kuei Kuan, Taichung (TW); Chin-Yang Wu, Hsinchu (TW); Ruey-Bin Sheen, Taichung (TW); Chih-Hsien Chang, New Taipei (TW)

(73) Assignee: TAIWAN SEMICONDUCTOR MANUFACTURING COMPANY, LTD (TW)

( * ) Notice: Subject to any disclaimer, the term of this patent is extended or adjusted under 35 U.S.C. 154(b) by 127 days.

(21) Appl. No.: 15/693,257

(22) Filed: Aug. 31, 2017

(65) Prior Publication Data

US 2019/0058480 A1  Feb. 21, 2019

Related U.S. Application Data

(60) Provisional application No. 62/545,782, filed on Aug. 15, 2017.

(51) Int. Cl.
*H03K 5/08* (2006.01)
*H03L 7/089* (2006.01)
(Continued)

(52) U.S. Cl.
CPC ............. *H03L 7/089* (2013.01); *H03L 7/083* (2013.01); *H03L 7/0992* (2013.01)

(58) Field of Classification Search
CPC ........ H03L 7/089; H03L 7/083; H03L 7/0992
(Continued)

(56) References Cited

U.S. PATENT DOCUMENTS

| 9,614,537 B1* | 4/2017 | Nandwana ................ H03L 7/24 |
| 2010/0259305 A1* | 10/2010 | Lee ......................... H03L 7/099 |
| | | 327/157 |

(Continued)

FOREIGN PATENT DOCUMENTS

TW   201624926 A   * 12/2016

OTHER PUBLICATIONS

Deng et al., "A 0.0066mm2 780μW Fully Synthesizable PLL with a Current-Output DAC and an Interpolative Phase-Coupled Oscillator Using Edge-Injection Technique," IEEE International Solid-State Circuits Conference, pp. 266-267 (Feb. 11, 2014).

(Continued)

*Primary Examiner* — Metasebia T Retebo
(74) *Attorney, Agent, or Firm* — Merchant & Gould P.C.

(57) ABSTRACT

A phase-locked loop circuit is disclosed. The circuit includes a digital bang-bang phase-locked loop (PLL) electrically connected to an input clock signal connection and an output clock signal connection, and a down-sampling circuit connected to the input clock signal connection. The circuit also includes a digitally-controlled delay line receiving an output of the down-sampling circuit, and an injection pulser receiving an output of the digitally-controlled delay line and connected to provide an injection pulse to a portion of the digital bang-bang phase-locked loop (PLL). The circuit further includes an injection timing calibration circuit connected to a control input of the digitally-controlled delay line. The circuit provides calibration of injection timing and bandwidth optimization, thereby reducing jitter in an output signal from the PLL.

20 Claims, 13 Drawing Sheets

(51) Int. Cl.
*H03L 7/099* (2006.01)
*H03L 7/083* (2006.01)

(58) Field of Classification Search
USPC .................................................. 327/156–159
See application file for complete search history.

(56) References Cited

U.S. PATENT DOCUMENTS

2012/0062293 A1* 3/2012 Liang ................... H03L 7/23
327/157
2017/0026048 A1* 1/2017 Huang ................... H03L 7/24

OTHER PUBLICATIONS

Huang et al., "A 2.4-GHz Subharmonically Injection-Locked PLL With Self-Calibrated Injection Timing," IEEE Journal of Solid-State Circuits, vol. 48, No. 2, pp. 417-428 (Feb. 2013).

Kuan et al., "A Bang-Bang Phase-Locked Loop Using Automatic Loop Gain Control and Loop Latency Reduction Techniques," IEEE Journal of Solid-State Circuits, vol. 51, No. 4, pp. 821-831 (Apr. 2016).

Kuan et al., "A Digital Bang-Bang Phase-Locked Loop with Automatic Loop Gain Control and Loop Latency Reduction," Symposium on VLSI Circuits Digest of Technical Papers, pp. C138-C139 (2015).

Kuan et al., "A Loop Gain Optimization Technique for Integer-N TDC-Based Phase-Locked Loops," IEEE Transactions on Circuits and Systems-I: Regular Papers, vol. 62, No. 7, pp. 1873-1882 (Jul. 2015).

Wei et al., "A Subharmonically Injection-Locked PLL With Calibrated Injection Pulsewidth," IEEE Transactions on Circuits and Systems-II: Express Briefs, vol. 62, No. 6, pp. 548-552 (Jun. 2015).

Zeng et al., "A Subharmonically Injection-Locked All-Digital PLL Without Main Divider," IEEE Transactions on Circuits and Systems-II: Express Briefs, vol. 62, No. 11, pp. 1033-1037 (Nov. 2015).

* cited by examiner

INJECTION-LOCKED DIGITAL BANG-BANG PHASE-LOCKED LOOP WITH TIMING CALIBRATION

CROSS-REFERENCE TO RELATED APPLICATIONS

The present application claims priority form U.S. Provisional Patent Application No. 62/545,782, filed on Aug. 15, 2017, the disclosure of which is hereby incorporated by reference in its entirety.

BACKGROUND

A phase-locked loop (PLL) is an electronic circuit with a voltage-driven oscillator that adjusts to match frequency of an input signal. PLLs are used in radio transceivers, telecommunications, clock multipliers, microprocessors and other devices which use synchronized signals. An injection-locked phase-locked loop (PLL) is a circuit architecture useable to achieve ultra-low jitter performance for such PLLs. Unfortunately, it has several drawbacks for mass production. Importantly, the injection timing has great impact on the injection performance.

In particular, as absolute value of injection timing offset gets greater, the deterministic jitter (DJ) plus random jitter (RJ) increase abruptly. Period jitter (PJ) increases as well. This difficulty in obtaining a correct timing is exacerbated by variations in process, supply voltage, and temperature variations that are experienced by the circuit, and as such, the timing issue may present itself in a circuit after manufacturing. Attempted solutions address the issue of jitter due to injection timing offset in a number of ways, such as through addition of phase detectors at various locations within the circuit. However, even in such attempted improved designs, correct injection timing is difficult to obtain, and phase error may be introduced; as such, jitter issues persist in such designs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
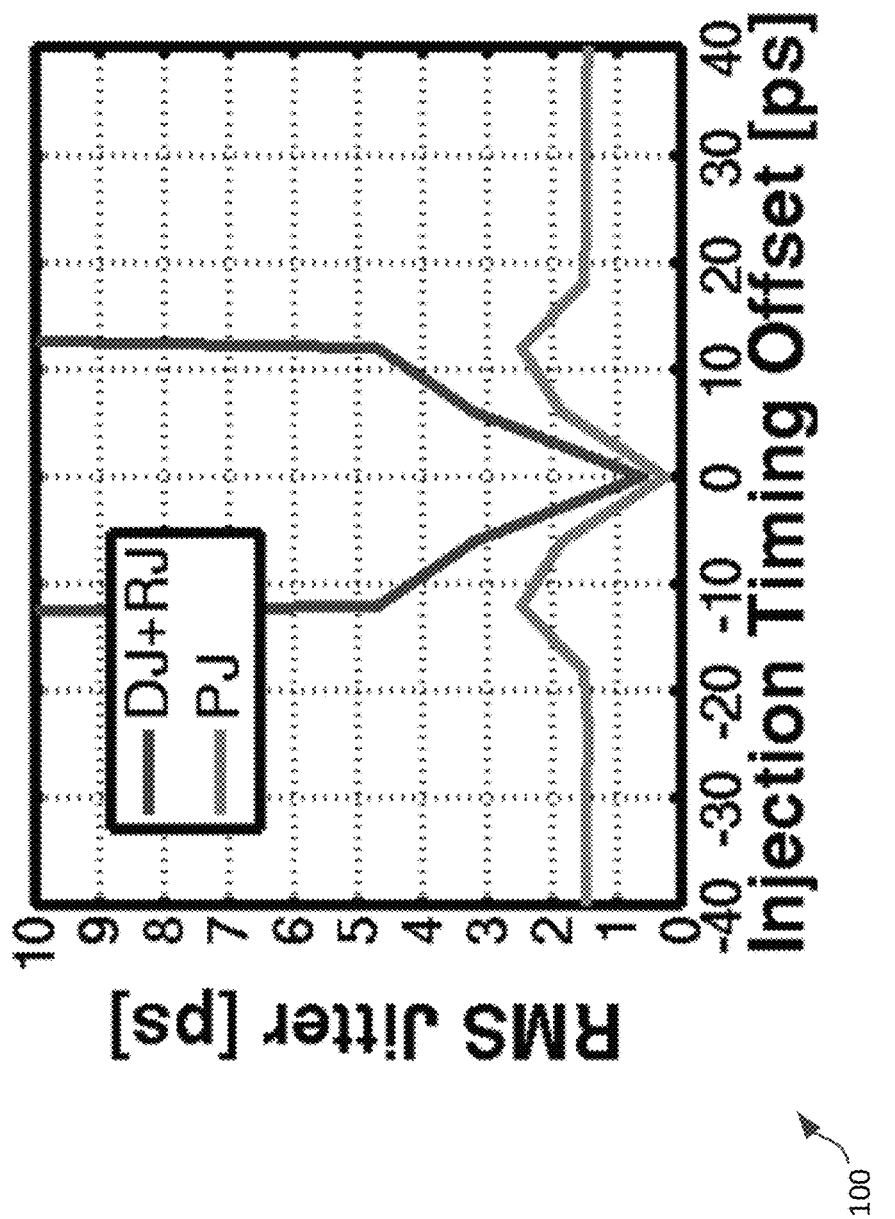
FIG. 1 is a graph illustrating jitter effects of offset injection timing in a PLL, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In general, the present disclosure relates to an injection-locked digital bang-bang phase-locked loop (PLL), or DBPLL. The DBPLL as disclosed herein provides improved jitter performance despite variations in process, operating voltage, or operating temperature. Accordingly, variations in oscillator frequency due to quantization noise or process variation will not greatly affect the circuit, allowing for improved accuracy across operating variations.

As noted above, variations in process and operational characteristics may result in variable timing of circuit components, which might introduce jitter of various types, including deterministic jitter (DJ), random jitter (RJ), and period jitter (PJ). An example of the detrimental jitter effects caused by variable timing of circuit components is seen in FIG. 1. Specifically, FIG. 1 illustrates a timing diagram 100 showing an effect of injection timing offset in an injection-locked phase-locked loop. Specifically, and as seen in the timing diagram 100, as an absolute value of injection timing offset gets greater, both deterministic jitter and random jitter increase abruptly. Additionally, period jitter increases as well. Accordingly, it is desirable to reduce timing offset to the extent possible. However, and as noted above, the exact desirable injection timing is affected by process, voltage, and temperature variations. Accordingly, in conjunction with embodiments of the present disclosure, an injection-locked DBPLL is implemented that more closely tracks an ideal injection timing, thereby reducing jitter and improving performance. Such a circuit self-tunes to achieve a proper injection timing and bandwidth to minimize jitter despite such process, voltage, or temperature variations, which is not generally realistic or possible to achieve in previous production circuits.

Figure 2:
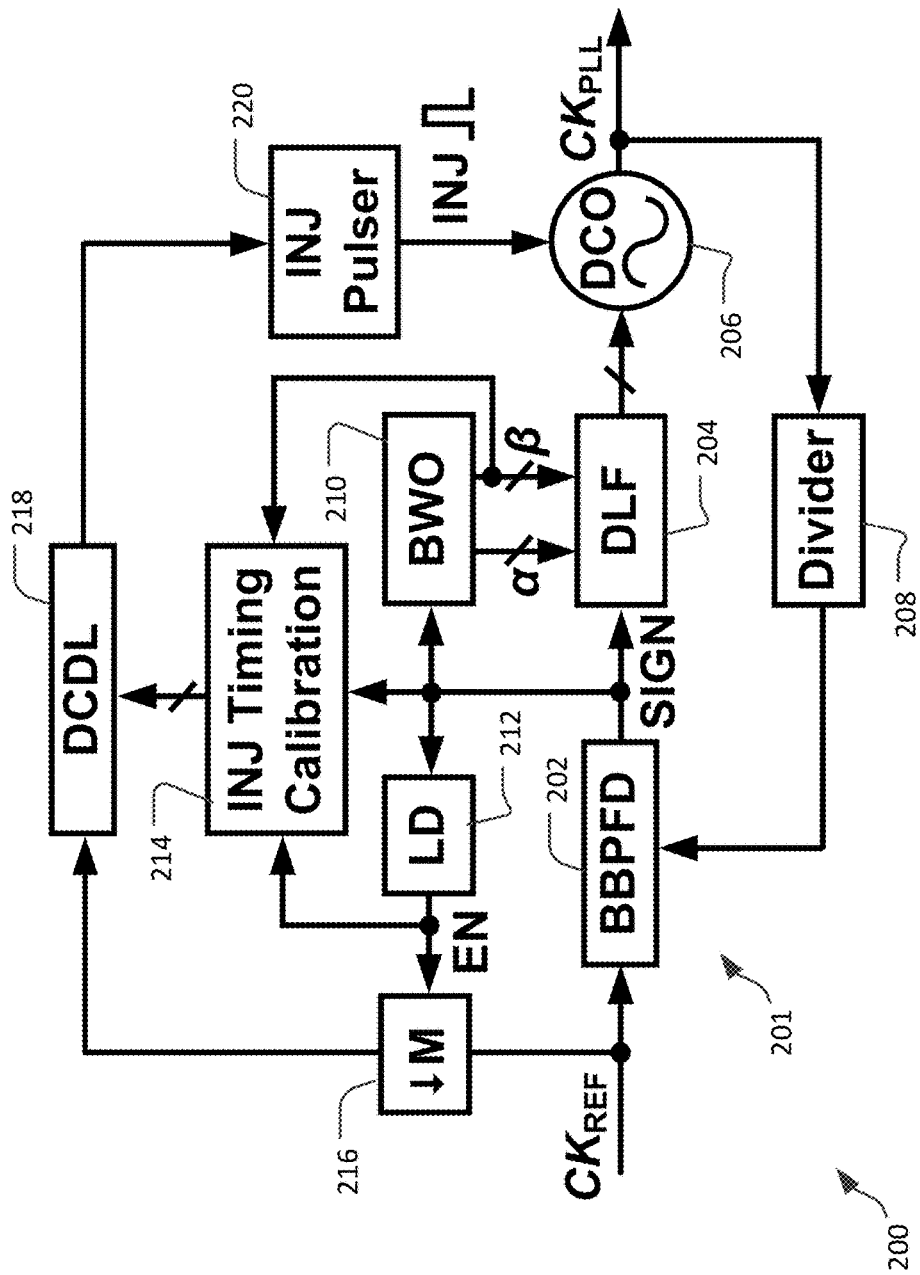
FIG. 2 is a block diagram of an injection-locked digital bang-bang phase-locked loop circuit, in accordance with some embodiments.

Referring now to FIG. 2, an example circuit 200 is illustrated that implements the injection-locked DBPLL, according to an example embodiment. In this specific arrangement the injection-locked DBPLL also includes features that provide for bandwidth optimization and reduction of jitter accumulation time. In the example shown, the circuit 200 receives a reference clock signal $CK_{REF}$, for example from an oscillator or another portion of an overall circuit design, and outputs a clock signal $CK_{PLL}$ that is conditioned using the injection-locked DBPLL. The reference clock signal is provided to a phase locked loop 201 including a bang-bang phase-frequency detector (BBPFD) 202, which outputs a phase shifted signal to be received by a digital loop filter (DLF) 204. The phase shifted signal is also considered a sign signal $\varepsilon$, i.e., representing a digital signal indicating a positive or negative offset from the reference clock. The digital loop filter 204 outputs signals to a digitally-controlled oscillator (DCO) 206, which outputs clock signal $CK_{PLL}$.

In the embodiment shown, a divider 208 is connected in a feedback loop from $CK_{PLL}$ to BBPFD 202. Additionally, the DLF 204 receives two inputs, designated $\alpha$ and $\beta$, from a bandwidth optimization circuit (BWO) 210, which represents coefficients generated by that circuit. An example implementation of BWO circuit 210 is discussed below in conjunction with FIG. 3.

In addition the output of the BBPFD 202 is provided to the BWO circuit 210, and also to a lock detector (LD) 212 and an injection timing calibration circuit 214. The lock detector outputs an enable signal to a down-sampling circuit 216, as well as to the injection timing calibration circuit 214. The injection timing calibration circuit 214 also receives as an input the $\beta$ output of the BWO 210.

In the embodiment shown, the down-sampling circuit receives the input clock $CK_{REF}$, and outputs a down-sampled clock signal to a digitally-controlled delay line (DCDL) 218. The DCDL 218 delays the down-sampled clock signal according to an output of the injection timing calibration circuit 214, and provides that signal to an injection pulser 220, which injects a pulse at the DCO 206.

In operation, once the DBPLL locks, the LD 212 triggers an enable signal that is output to the injection timing calibration circuit 214 and the down-sampling circuit 216. The down-sampled reference clock is then passed to the DCDL 218, which delays the clock signal by an amount adjusted by the injection timing calibration circuit 214. The injection pulser 220 generates injection pulses at the edge of the signal from the DCDL 218. The BWO circuit 210 generates coefficients $\alpha$ and $\beta$, which represent gain coefficients in integral and proportional paths of the BWL circuit 210, of which an example of such coefficient generation is discussed in conjunction with FIG. 3. The coefficients $\alpha$ and $\beta$ are used for gain inputs for integral and proportional paths to the digital loop filter (DLF) 204.

Figure 3:
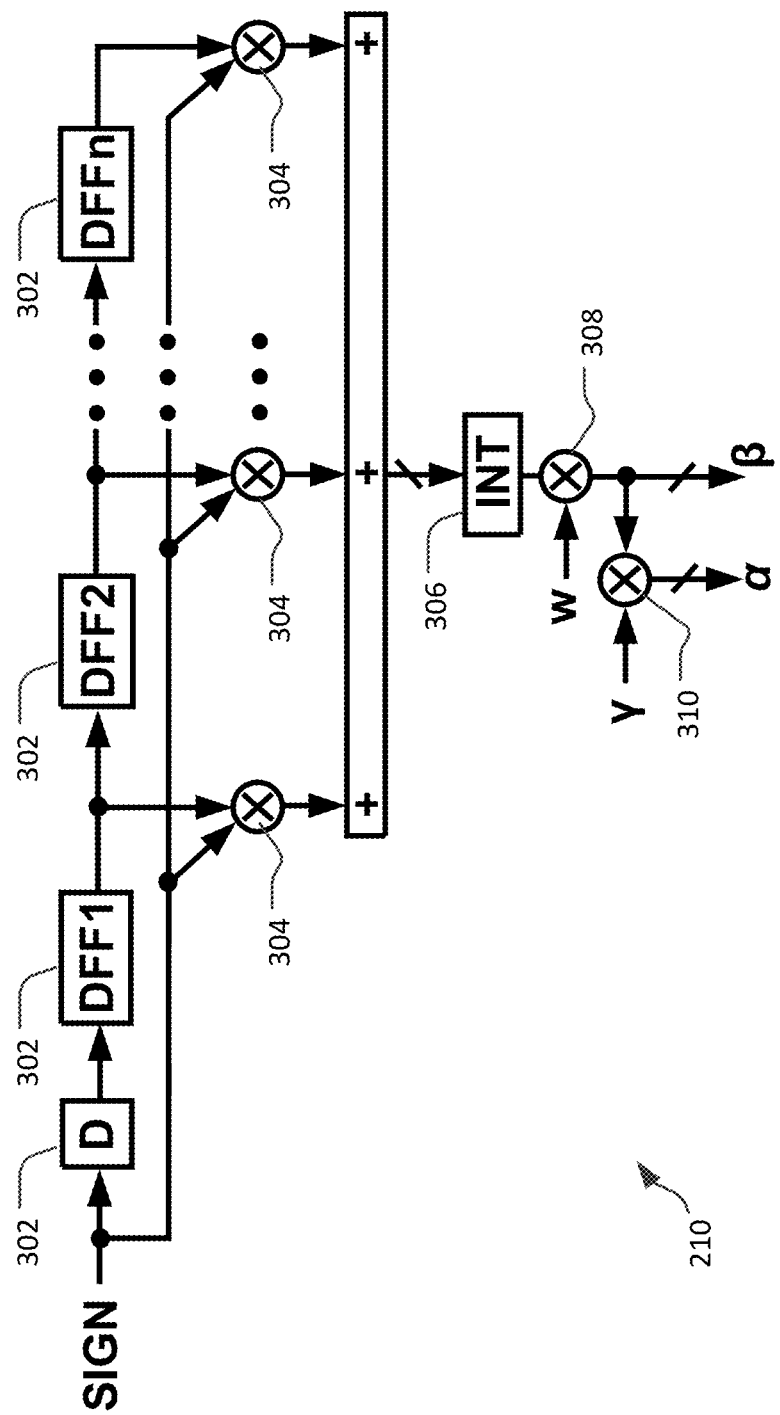
FIG. 3 is a block diagram of a bandwidth optimization circuit useable in the injection-locked digital bang-bang phase-locked loop circuit of FIG. 2, in accordance with some embodiments.

Referring to FIG. 3, an illustration of the BWO circuit 210 is illustrated, according to an example embodiment. The BWO circuit 210 generally outputs coefficients $\alpha$ and $\beta$ in response to receiving the phase shifted signal, which represents an offset, or error signal, reflected as sign signal $\varepsilon$. The BWO circuit 210 includes a plurality of flip flop stages, in the embodiment shown represented as a plurality of D flip flops (DFFs) 302. The number of DFFs 302 included in series can vary in different embodiments. The BWO circuit 210 further includes a plurality of multipliers 304 and an integrator 306. In the example shown, sign signal $\varepsilon$, representing an error signal, is provided to the DFFs 302, which latch the signal by one clock cycle; the sign signal $\varepsilon$ is provided to each of the plurality of multipliers 304, which also each receive one of the latched sign signals from a respective DFF 302. The products of the sign signal $\varepsilon$ (error signal) with each delayed error signal, generated at the multipliers 304, are combined and integrated together at integrator 306. The output of the integrator is then scaled by w at multiplier 308 to generate the $\beta$ coefficient. Accordingly, the output of the $\beta$ coefficient is reflected as:

$$\beta_k = \beta_{k-1} + w \cdot (\varepsilon_k \cdot \varepsilon_{k-D} \varepsilon_k \cdot \varepsilon_{k-D-1} + \varepsilon_k \cdot \varepsilon_{k-D-2} \ldots \varepsilon_k \cdot \varepsilon_{k-D-n})$$

In the above equation, subscript k denotes the iteration cycle, and D denotes the additional delayed time (e.g., the stage of DFF). In addition, parameter $\alpha$ is calculated as:

$$\alpha_k = \gamma \cdot \beta_k$$

To generate coefficient $\alpha$, the $\beta$ coefficient is further scaled at a multiplier 310 by $\gamma$. In example embodiments, scaling multiplier w corresponds to $\frac{1}{2}^m$. In an example embodiment, w is set at $2^{-12}$ and $\gamma$ is set at $2^{-5}$.

Accordingly, the bandwidth optimization circuit 300 reacts based on the extent to which the sign signal $\varepsilon$ is offset from ideal timing, and controls the DLF 204 accordingly. Furthermore, the bandwidth optimization circuit 300 acts such that in cases where a slope is overloaded in the sign signal $\varepsilon$, a small bandwidth is generated, in the case of granular sign signal (e.g., an even +/− sign signal) a large bandwidth can be generated, and in the case of a random sign signal $\varepsilon$ a bandwidth is tuned to that signal for appropriate bandwidth. Further details regarding bandwidth optimization are further described in the following publications, the disclosure of which are hereby incorporated by reference in their entireties:

T.-K. Kuan, and S.-I. Liu, "A loop gain optimization technique for integer-N TDC-based phase-locked loops," IEEE Trans. Circuits Syst. I, Reg. Papers, vol. 62, no. 7, pp. 1873-1882, July 2015.

T.-K. Kuan, and S.-I. Liu, "A digital bang-bang phase-locked Loop with automatic loop gain control and loop latency reduction," in IEEE Symp. VLSI Circuits Dig. Tech. Papers, June 2015, pp. C138-C139.

T.-K. Kuan, and S.-I. Liu, "A bang-bang phase-locked Loop using automatic loop gain control and loop latency reduction techniques," IEEE J. Solid-State Circuits, vol. 51, no. 4, pp. 821-831, April. 2016.

Figure 4A:
FIGS. 4A-4B are timing diagrams illustrating example down-sampling effects of a downsampling circuit useable within the injection-locked digital bang-bang phase-locked loop circuit of FIG. 2, in accordance with some embodiments.
Figure 4B:
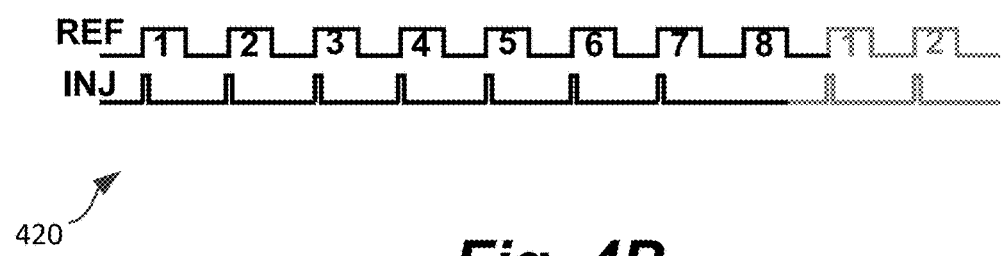

Referring now to FIGS. 4A-B, a timing diagram 400 is shown, illustrating a down-sampling effect on the injection pulse. Specfically, in FIG. 4A, a down-sampling effect showing an example in which M=2, as applied to the circuit of FIG. 3. As seen in FIG. 4A, an injection pulse occurs at each input reference signal. In FIG. 4B, the injection pulse is downsampled such that M=7/8, such that for every eight input signals, there are seven output signals (in the example shown, at the rising edge of the reference clock signal) for each eight input signals. In either case, down-sampling circuit 216 of FIG. 2 receives a setting M that defines the downsampling performed. In various embodiments, the setting M defines the downsampling rate, and therefore defines, at least in part, a rate at which the circuit 200 will converge to the reference clock frequency. In example embodiments, the setting M is greater than 1; for example, M=8/7 or M=2 in the examples illustrated below.

Figure 5A:
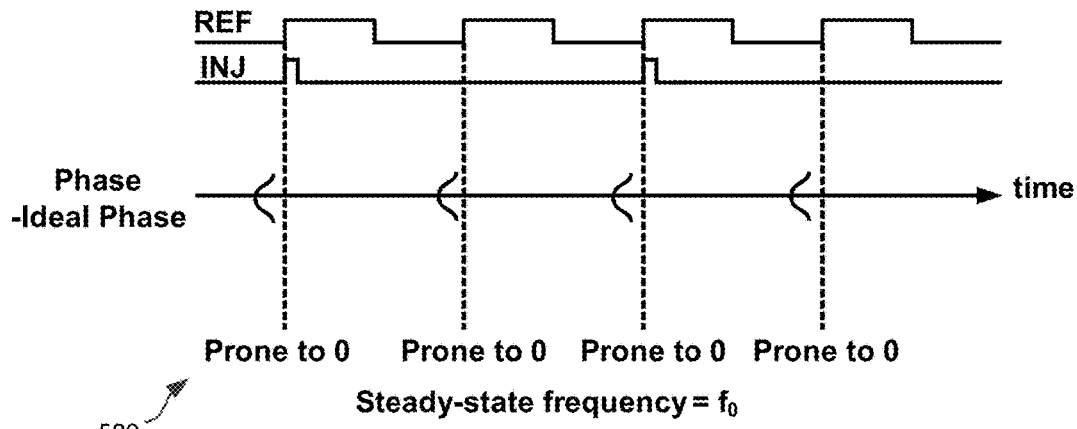
FIGS. 5A-5C are timing diagrams showing timing calibration effects of the injection-locked digital bang-bang phase-locked loop circuit of FIG. 2, in accordance with some embodiments.
Figure 5B:
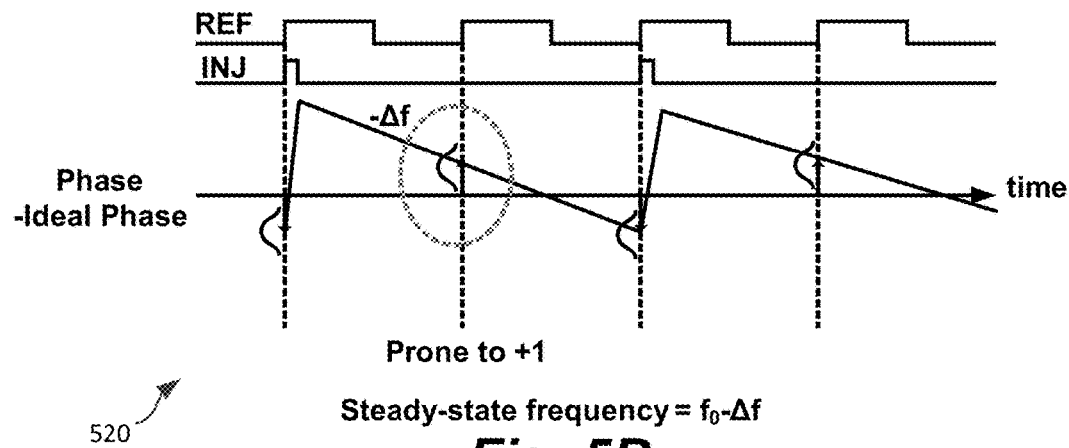
Figure 5C:
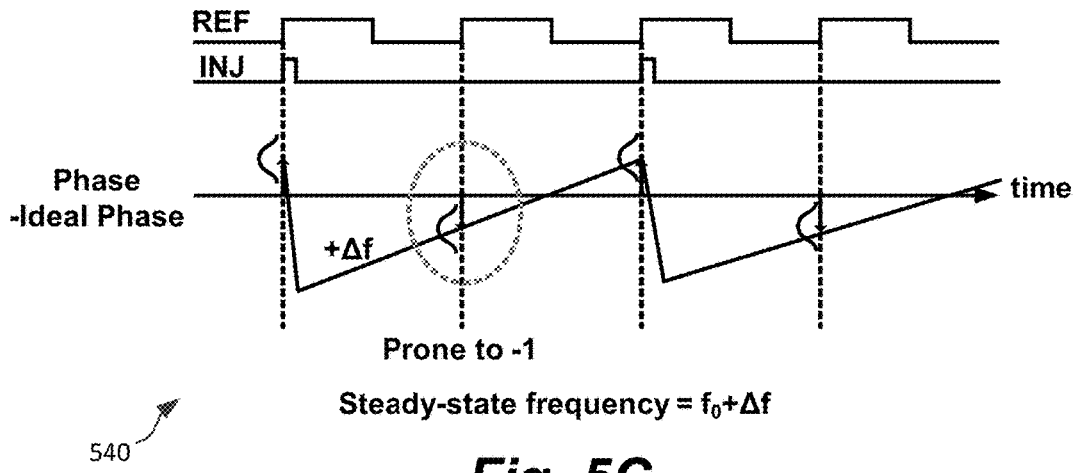

Referring to FIGS. 5A-5C, waveforms are shown illustrating background injection timing calibration that is performed using the circuit 200 of FIG. 2, in particular by the injection timing calibration circuit 214. FIG. 5A illustrates a steady-state waveform 500 when the injection pulse occurs at a correct injection timing with M=2, i.e., no injection. Since the phase does not result in steady-state phase error, the average of phase deviation from ideal phase is zero. Accordingly, in this instance, a steady state frequency corresponds to $f_0$, and no adjustment is required.

In FIG. 5B, a waveform 520 is shown in which M=2, but for which the injection pulse leads, or occurs prior to, perfect injection timing. Due to this, the sign signal (sign signal ε) is prone to being a −1 signal Because of this, as seen in the waveform 520, the average of phase deviation from ideal phase at the skipped cycle is positive. In this instance, the steady state frequency can be stated as $f_0-\Delta f$, and thus, early injection timing decreases the phase periodically.

In FIG. 5C, waveform 540 is shown in which M=2 but for which the injection pulse follows perfect injection timing. In this instance, the sign signal is prone to being a +1 signal. As such, as seen in waveform 540, the average of phase deviation from ideal phase at the skipped cycle is negative. Accordingly, the steady state frequency in this instance can be stated as $f_0+\Delta f$, and thus, late injection timing increases the phase periodically.

Accordingly, and referring to FIGS. 5A-5C as applied in the circuit 200 of FIG. 2, the injection timing calibration circuit 214 properly decreases or increases the delay of the DCDL 218 by the averaged polarity of phase error. Note that if the injection timing pulse is generated without skipping some cycles periodically, the average of phase deviation would be 0 and therefore no useful information for injection timing calibration can be obtained.

Figure 6A:
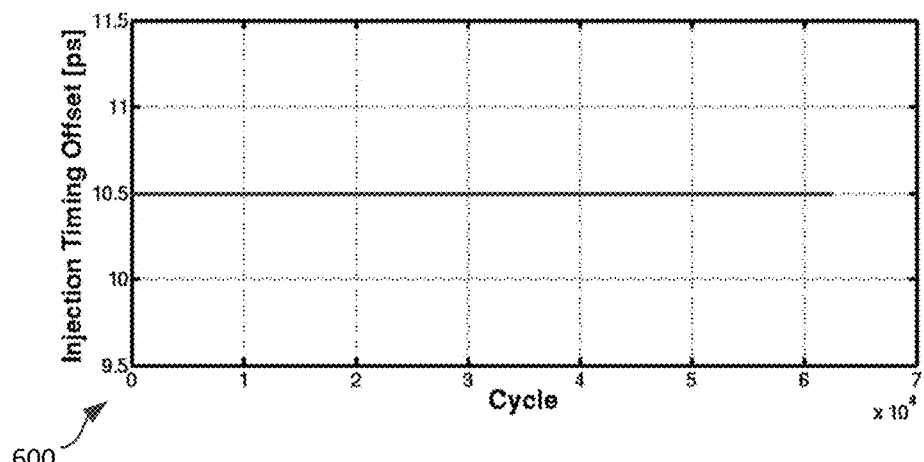
FIGS. 6A-6C are waveforms of injection timing, bandwidth optimization effects, and resulting jitter measurements in the event of no injection timing calibration.
Figure 6B:
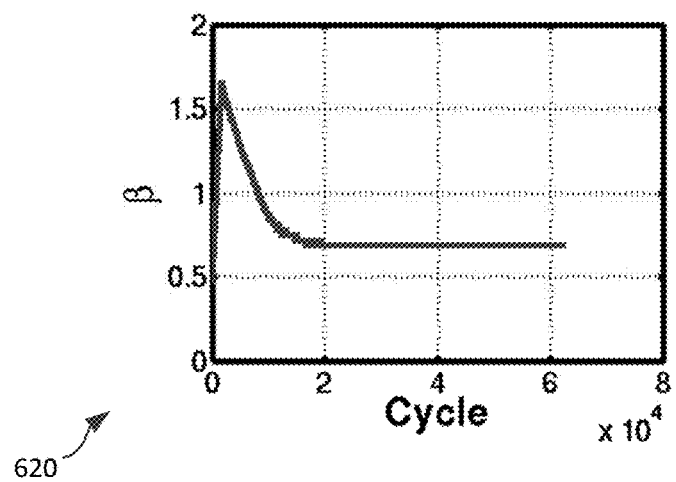
Figure 6C:
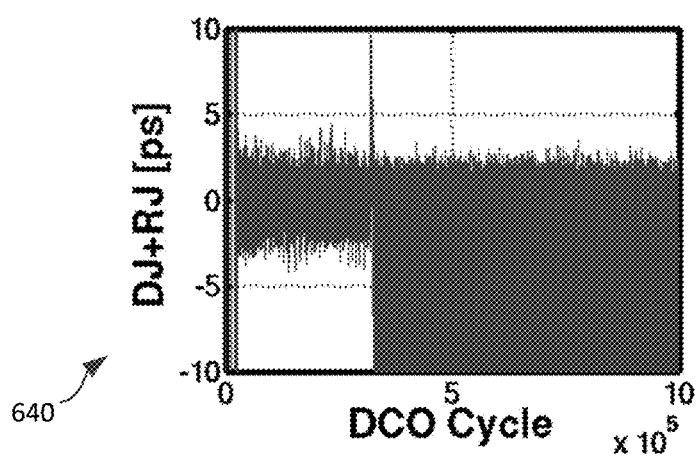

Referring now to FIGS. 6-8 generally, example waveforms illustrating transient response of the circuit 200 of FIG. 2 are illustrated, in accordance with example embodiments of the present disclosure, showing differing injection timing, β, and jitter effects of the circuit 200. First, and as illustrated in FIGS. 6A-6C, an example is shown without injection timing calibration (seen in waveform 600 of FIG. 6A). In this example, the injection timing offset was 10.5 picoseconds. Accordingly, and as seen in waveform 620 of FIG. 6B, the β value reaches a single steady-state value. Furthermore, at the time of injection (at about 20,000 cycles), jitter increases, reaching a value of 4.6 picoseconds (RMS) for deterministic and random jitter (seen in waveform 640 of FIG. 6C).

Figure 7A:
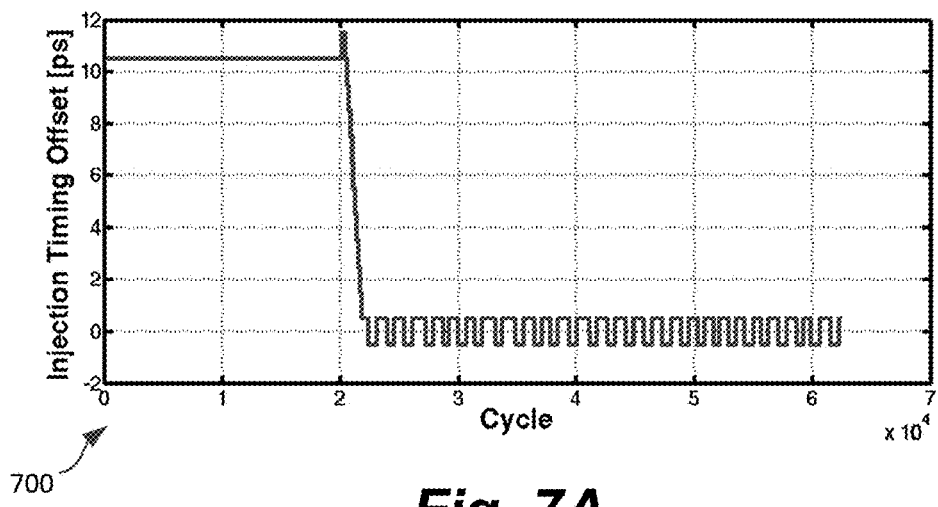
FIGS. 7A-7C are waveforms of injection timing, bandwidth optimization effects, and resulting jitter measurements when injection timing calibration is implemented in the injection-locked digital bang-bang phase-locked loop circuit of FIG. 2, in accordance with some embodiments.
Figure 7B:
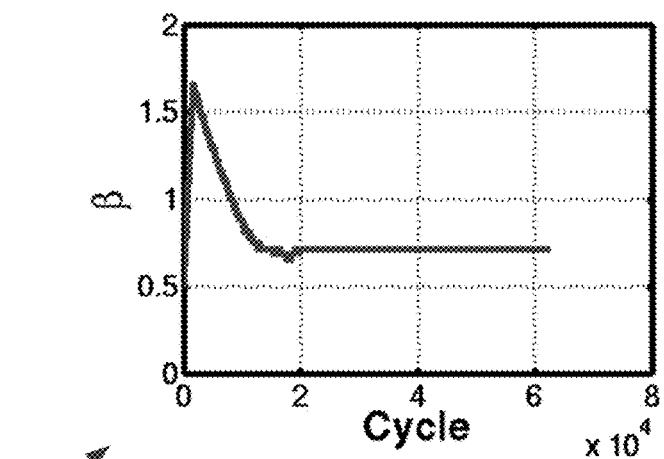
Figure 7C:
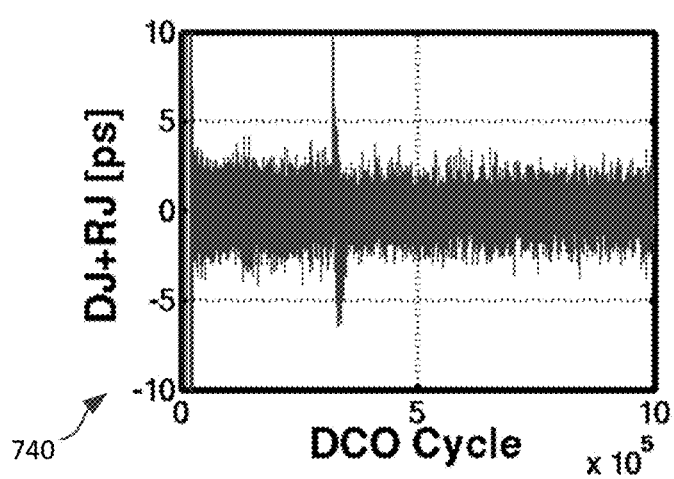

In FIGS. 7A-7C, an example in which injection timing calibration is introduced is shown. In this example, the downsampling constant M is set to 2 (i.e., every other clock cycle). In FIG. 7A, waveform 700 illustrates an injection timing calibration that is performed starting at about 200, 000 cycles, with background calibration occurring thereafter. Furthermore, in waveform 720 of FIG. 7B, the β value adjusts toward a constant value prior to injection timing calibration; however, after injection timing calibration, β remains effectively constant. As seen in waveform 740 of FIG. 7C, the injection timing calibration is triggered and, shortly thereafter, jitter decreases (in this case, to a value of about 0.82 picoseconds (RMS)).

Figure 8A:
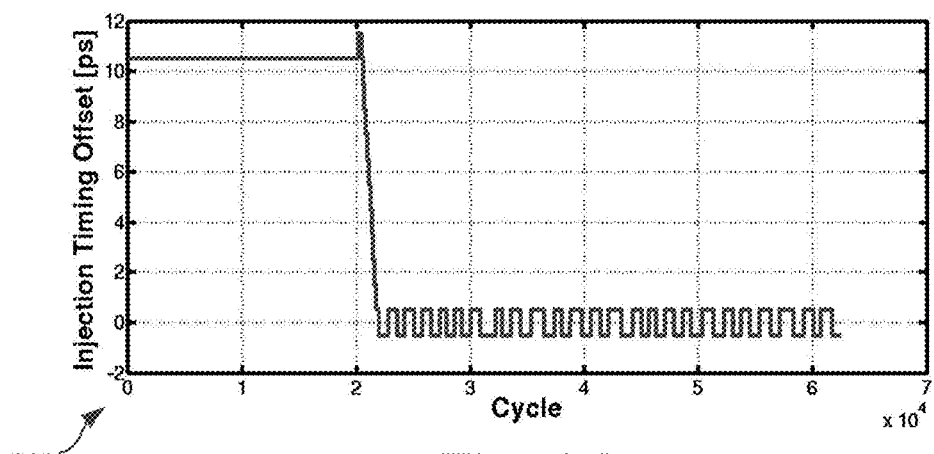
FIGS. 8A-8C are waveforms of injection timing, bandwidth optimization effects, and resulting jitter measurements when injection timing calibration and bandwidth optimization are both implemented in the injection-locked digital bang-bang phase-locked loop circuit of FIG. 2, in accordance with some embodiments.
Figure 8B:
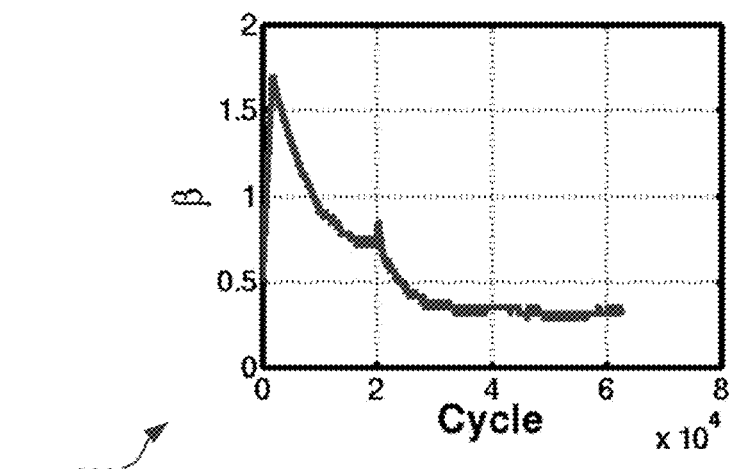
Figure 8C:
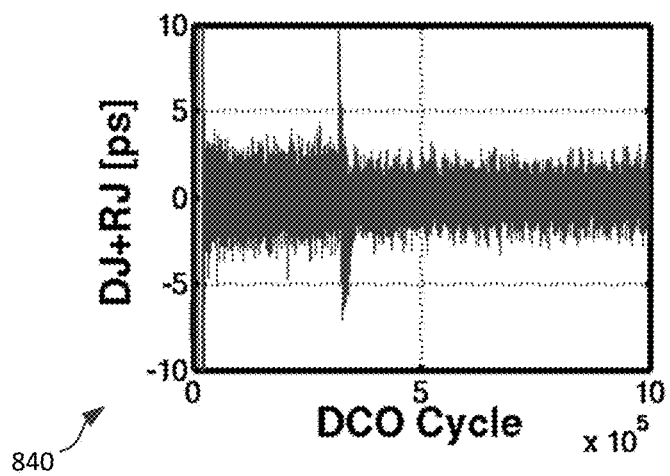

Referring to FIGS. 8A-8C, an example transient response of the circuit 200 of FIG. 2 is illustrated. In particular, FIG. 8A illustrates a waveform 800 in which the injection-locked DBPLL 200 is implemented with a down-sampling period of M=2. In this example, the injection and injection timing calibration start at about 200,000 reference cycles. As seen in waveform 800, injection timing offset is gradually decreased by the calibration circuit. FIG. 8B illustrates that the bandwidth factor β is continuously calibrated in the background by the BWO circuit 210. As seen in waveform 820, at first β settles after the PLL locked (before the 200,000 cycle occurrences), but then settles at different value after injection (at steady state). FIG. 8C illustrates a waveform 840 showing the resulting deterministic jitter and random jitter after injection begins. When injection is triggered and the injection timing offset is 10.5 ps, the total jitter increases considerably (annotated at the spike showing the start of injection). After the injection timing is calibrated, the total jitter becomes even smaller than that without injection (0.75 picoseconds RMS).

Figure 9A:
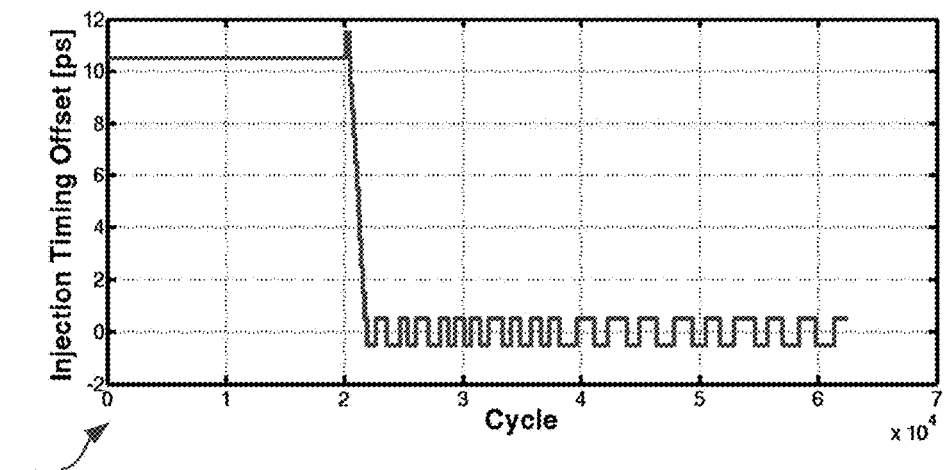
FIGS. 9A-9C are waveforms of injection timing, bandwidth optimization effects, and resulting jitter measurements when injection timing calibration and bandwidth optimization are both implemented in the injection-locked digital bang-bang phase-locked loop circuit of FIG. 2, including two instances of injection signal introduction, in accordance with some embodiments.
Figure 9B:
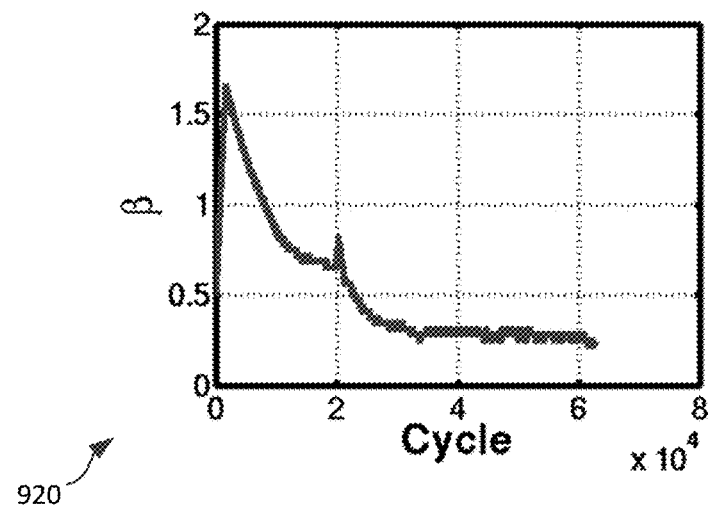
Figure 9C:
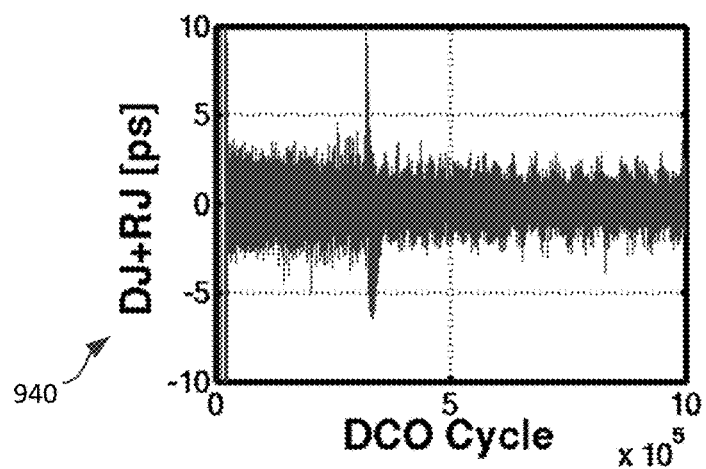

Referring to FIGS. 9A-9C, a further example transient response of the circuit 200 of FIG. 2 is illustrated. FIG. 9A illustrates a waveform 900 in which the injection-locked DBPLL 200 is implemented with a down-sampling period of M=8/7. As in the example of FIGS. 8A-8C, the injection and injection timing calibration start at about 200,000 reference cycles. As seen in FIG. 9A, a waveform 900 showing the injection timing offset illustrates a background calibration that occurs after the injection and injection timing calibration start. Furthermore, like in FIG. 8B, in FIG. 9B, waveform 920 shows the β value settling first after the PLL locked, and second at a lower approximate value after injection. It is noted that, in FIGS. 8B and 9B, the value is not exactly constant, but is consistently adjusted by the BWO circuit 210. By way of contrast, in FIGS. 7A-7C, where bandwidth optimization is not employed, the value converges to a constant value.

Figure 10A:
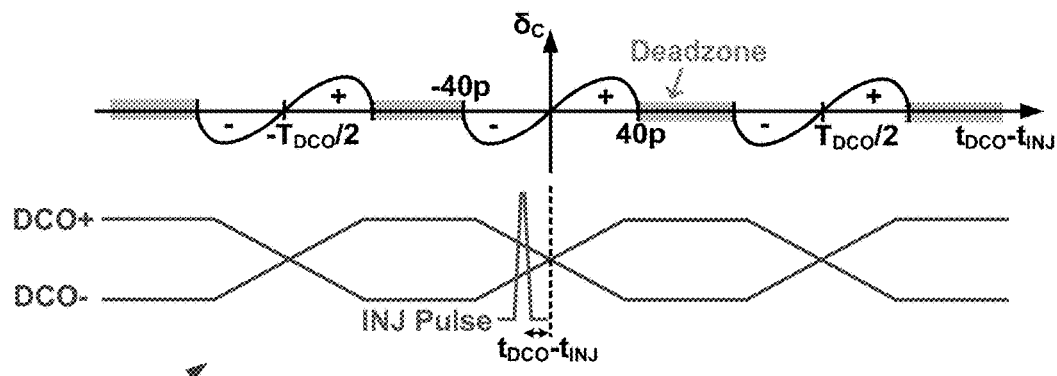
FIGS. 10A-10C are waveforms and signal timing diagrams illustrating an effect of an injection pulse during a dead zone of PLL operation, in accordance with some embodiments.
Figure 10B:
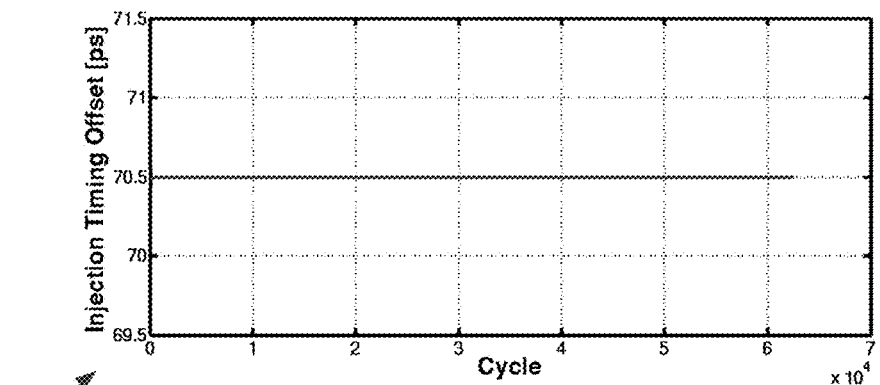
Figure 10C:
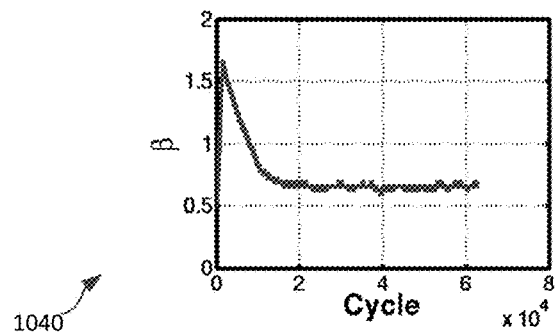

It is noted that in some embodiments, a "dead zone" may occur in which an injection signal might not be detected, and may not therefore correctly calibrate the circuit 200. Specifically, and referring back to FIG. 2, the DCO 206 is selected such that an appropriate injection window can be provided across operating conditions of the circuit 200. However, it is noted that it might be possible that, for some DCO designs, the effective injection window does not cover all the period of the DCO 206. In other words, there is dead zone of injection. Once the injection falls in the dead zone, the phase shift due to injection is 0, having the same effect as if there was no injection or perfect injection. Therefore, the injection timing calibration circuit 214 would mistake an injection during this dead zone for perfect injection. Accordingly, FIGS. 10A-C show transient response of an injection-locked DBPLL 200, as is discussed above. In particular, FIGS. 10A-C show where initial injection timing falls in a dead zone. In such a scenario, because the injection pulse occurs during the dead zone (as seen in signal diagram 1000), there is no injection pulse that is detected. Accordingly, the injection timing offset will remain constant, as seen in waveform 1020 of FIG. 10B, and the β value output by the BWO circuit 210 converges to a single value (as seen in graph 1040 of FIG. 10C). Therefore delays generated by circuit 200 are not adjusted. In other words, the injection timing is not calibrated because the injection timing calibration circuit 214 mistakes this injection timing for perfect injection.

Figure 11A:
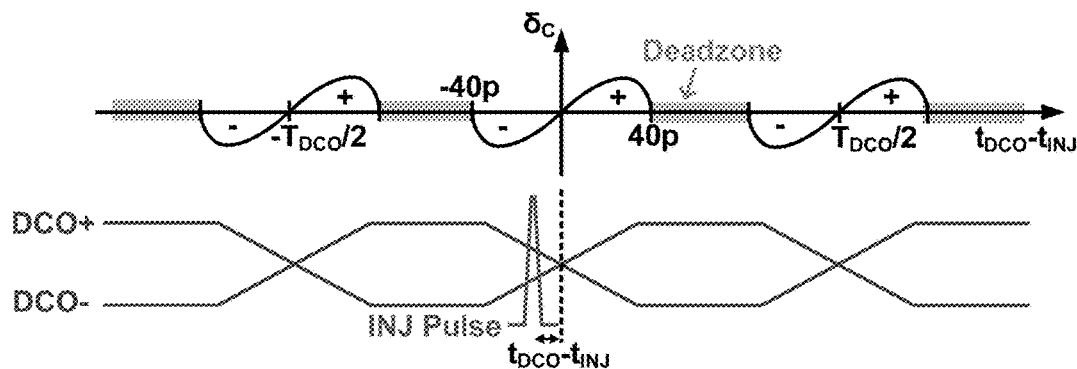
FIGS. 11A-11C are waveforms and signal timing diagrams illustrating a method of accounting for injection pulses occurring during a dead zone of PLL operation, in accordance with some embodiments.
Figure 11B:
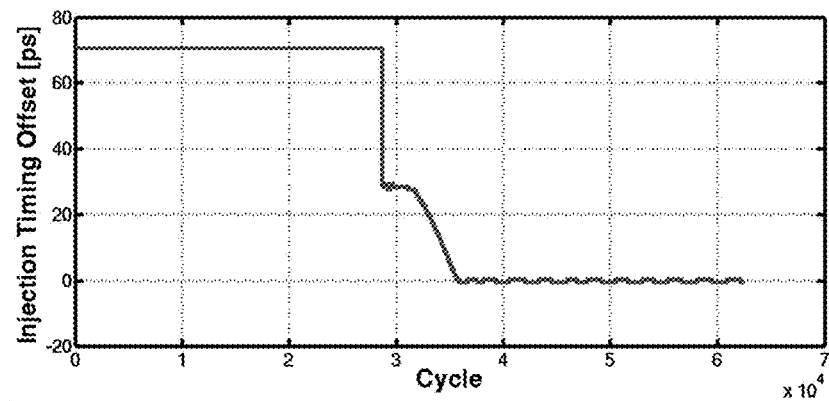
Figure 11C:
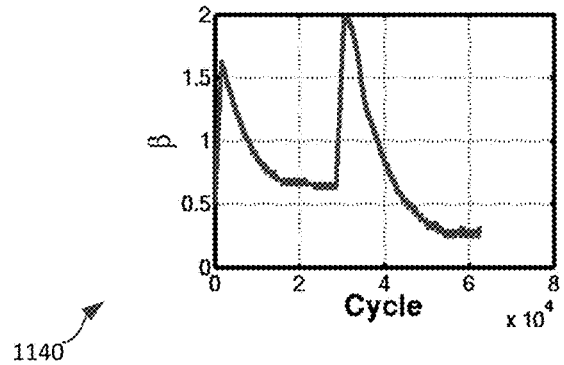

To distinguish whether the injection falls in the dead zone, as illustrated in FIGS. 11A-C, the output of the β value from the BWO circuit 210 can be monitored to determine where the settled β value changed due to effective injection based on the signal diagram 1100 of FIG. 11A. If the settled β does not change (the values before injection and after injection) due to injection, the injection timing calibration circuit 214 will cause a change in the delay time (e.g., as seen in the changed injection between cycles 0-3 and cycles 4+ in waveform 1120 of FIG. 11B), and the injection will finally get out of the dead zone. Accordingly, the β value will change after the changed injection timing (as seen in graph 1140 of FIG. 11C).

Figure 12:
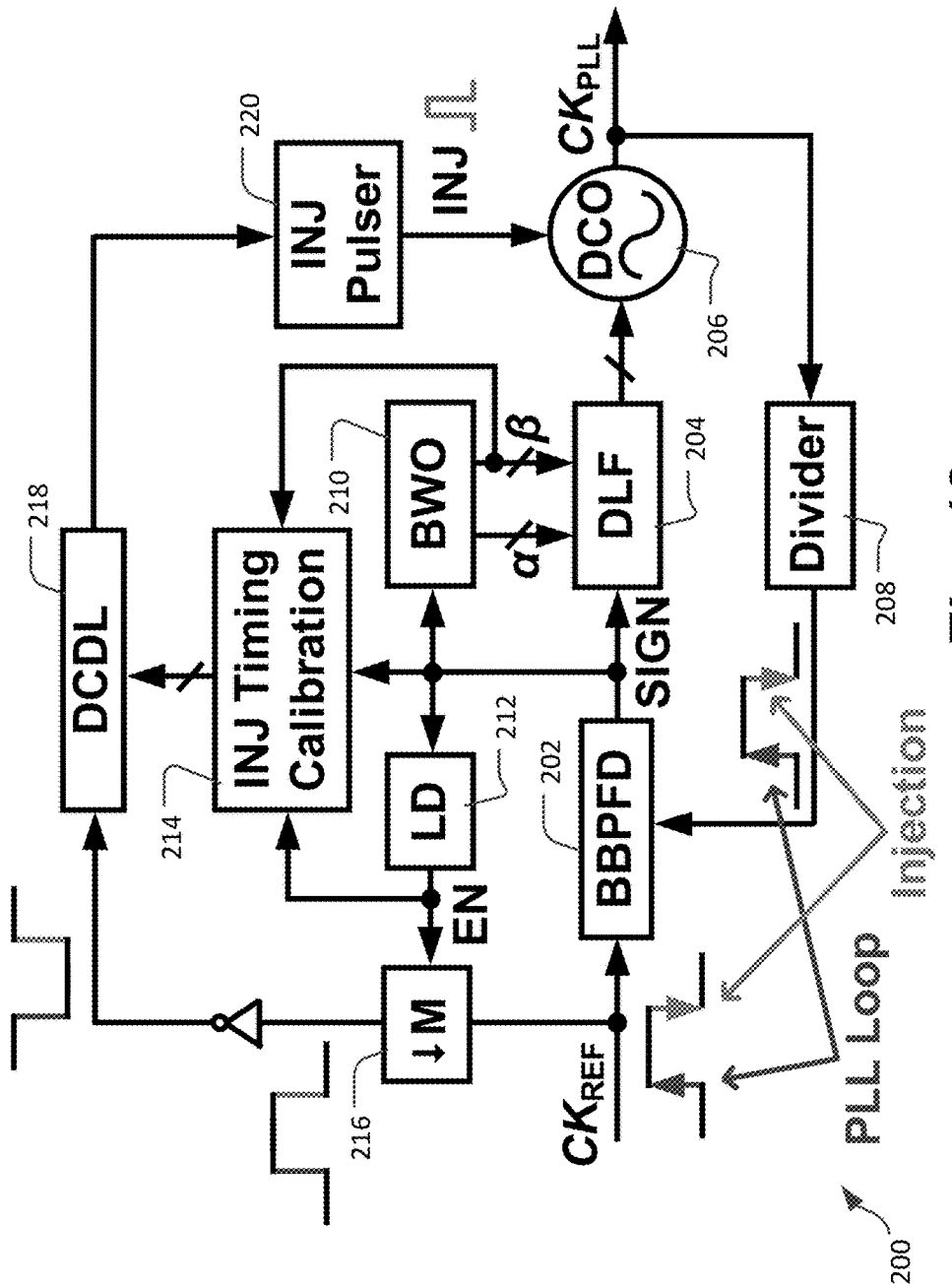
FIG. 12 is a block diagram of an injection-locked digital bang-bang phase-locked loop circuit in accordance with FIG. 2, illustrating injection signals at multiple locations within the circuit, in accordance with some embodiments.

In addition to the above, output jitter can further be reduced using one or more additional techniques. For example, in an example embodiment, jitter compensation mechanisms can be applied both to the main PLL (e.g., as fed back to BBPFD 202 via divider 208) and at the injection signal provided by the injection pulser 220. Because phase compensation, or cleaning, occurs at each rising edge of the reference clock, random jitter is accumulated between two consecutive phase compensation occurrences. Because a shorter jitter accumulation time results in a smaller jitter value, use of two jitter compensation mechanisms at different times effectively shortens the jitter accumulation time. As seen in FIG. 12, injection timing can be used that is far from the reference clock edges of the BBPFD 202. By separating the two compensation events (e.g., by injecting signals at the injection pulser 220 and on the falling edge of the PLL signal coming from divider 208) jitter can be reduced, for example to 670 fs or lower from 750 fs, in an example implementation (e.g., as reflected in FIGS. 9A-9C).

Referring generally to the above, it is noted that the various downsampling values, injection timing calibration situations, and bandwidth optimization implementations can cause different levels of jitter. The possible jitter values from such circuit variables are reflected in Table 1, below:

TABLE 1

Circuit Variables As Affecting Total Jitter

|  | Case 1 | Case 2 | Case 3 | Case 4 | Case 5 |
| --- | --- | --- | --- | --- | --- |
| Injection | X | M = 1/1 | M = 2/1 | M = 2/1 | M = 8/7 |
| Injection Timing Calibration | X | X | ○ | ○ | ○ |
| Bandwidth Optimization | ○ | X | X | ○ | ○ |
| Total Jitter (ps) | 1.1 ps | 4.6 ps | 0.82 ps | 0.75 ps | 0.67 ps |

It is noted that in Table 1, above, a loop latency of the circuit 200 is set at 750 picoseconds, and the DCO 206 is set to have a 4 GHz frequency and 1 MGz offset frequency, leading to a −87 dBc/Hz power ratio of a signal to carrier signal. In conjunction with use of the circuit, the reference signal REF will have a power ratio of −150 dBc/Hz.

Figure 13:
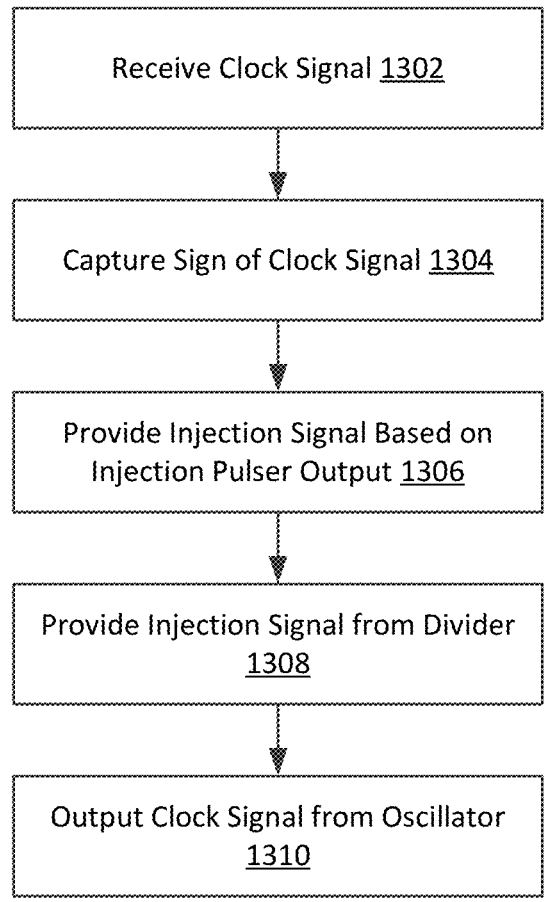
FIG. 13 is a flowchart of a method for reducing jitter in a phase-locked loop, in accordance with some embodiments.

Referring now to FIG. 13, a flowchart of an example method 1300 for reducing jitter in a phase-locked loop is discussed. The method 1300 can be performed, for example, using the circuits of FIGS. 2-3 and 12, discussed above.

In the example embodiment shown, the method 1300 includes receiving a clock signal (step 1302) and capturing a sign of the clock signal (step 1304). Capturing the sign of the clock signal can be performed, for example, using a phase frequency detector, such as the BBPFD 202 of FIG. 2.

In the example shown, the method 1300 further includes providing an injection signal based on an output of an injection pulser to a digitally-controlled oscillator (step 1304). The output of the injection pulser can be, for example, based on a downsampled version of the input clock signal delayed by a digitally-controlled delay line, which is controlled by an injection timing calibration circuit that uses the output of the phase frequency detector for such calibration. The phase frequency detector can be implemented as the BBPFD 202 of FIGS. 2 and 12.

In the example shown, the method 1300 further optionally includes introducing a further injection signal based on output of a divider to the phase frequency detector Referring to FIGS. 1-13 generally, as compared to other attempts to reduce jitter, the circuit and variations thereof as discussed in the present disclosure have a number of advantages. For example, as compared to existing attempts to mitigate the issue of variable injection timing, other designs utilize an additional phase detector (PD) to monitor output phase shift that results from injection, while the PLL operates in an open loop. In such situations, there is mismatch between the PD and phase frequency detector, causing consistently imperfect timing. Furthermore, such a design is generally static, in that it does not track changes in supply voltage and/or temperature drift after calibration. In other designs, an additional PD can be used to align the injection with oscillator output; however in this scenario, steady phase error occurs from unbalanced PD inputs from high-speed and low-speed clocks. In still further arrangements, two oscillator clocks can be used to avoid use of two clock paths; however use of two different oscillators necessarily introduces possible mismatch due to process variation between the oscillators, leading to poor jitter performance.

By way of contrast, the circuit of the present application tunes the PLL frequency to reduce jitter by continuously monitoring circuit state and adjusting an injection signal based on the monitored offset. The present circuit also optionally adjusts bandwidth continuously to quickly respond when needed to accommodate possible jitter effects.

In accordance with the present disclosure, a phase-locked loop circuit is disclosed. The circuit includes a digital bang-bang phase-locked loop (PLL) electrically connected to an input clock signal connection and an output clock signal connection, and a down-sampling circuit connected to the input clock signal connection. The circuit also includes a digitally-controlled delay line receiving an output of the down-sampling circuit, and an injection pulser receiving an output of the digitally-controlled delay line and connected to provide an injection pulse to a portion of the digital bang-bang phase-locked loop (PLL). The circuit further includes an injection timing calibration circuit connected to a control input of the digitally-controlled delay line.

In a further aspect, a method of reducing jitter in a phase-locked loop is included. The method can include receiving a clock signal at a phase-locked loop and a downsampling circuit, and, based on a sign of the clock signal captured by a phase frequency detector included in the phase-locked loop, calibrating an injection signal timing and enabling output of the downsampling circuit. The method can further include providing an injection signal to a digitally-controlled oscillator included in the phase-locked loop based at least in part on output of an injection pulser receiving an output of a digitally-controlled delay line, the digitally controlled delay line controlled by the calibrated injection signal timing to apply a variable delay to an output from the downsampling circuit. The method can also include outputting a clock signal from the digitally-controlled oscillator based at least in part on the output signal received from the injection pulser.

In a still further aspect, an injection-locked digital bang-bang phase-locked loop (PLL) circuit is disclosed. The circuit includes a digital bang-bang phase-locked loop (PLL) electrically connected to an input clock signal connection and an output clock signal connection. The digital bang-bang PLL includes a bang-bang phase frequency detector, a digital loop filter connected to a signal output of the bang-bang phase frequency detector, a digitally controlled oscillator receiving an output signal of the digital loop filter, the digitally controlled oscillator configured to output a resulting clock signal at the output clock signal connection, and a divider providing a signal feedback from an output of the digitally controlled oscillator to the bang-bang phase frequency detector. The circuit also includes a down-sampling circuit connected to the input clock signal connection, and a digitally-controlled delay line receiving an output of the down-sampling circuit. The circuit can further include an injection pulser receiving an output of the digitally-controlled delay line and connected to provide an injection pulse to the digitally controlled oscillator, and an injection timing calibration circuit connected to a control input of the digitally-controlled delay line. The circuit can also include a bandwidth optimization circuit connected to the signal output of the bang-bang phase frequency detector and having a control output connected to the digital loop filter.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A phase-locked loop (PLL) circuit comprising:
    a phase-locked loop (PLL) electrically connected to an input clock signal connection and an output clock signal connection;
    a down-sampling circuit connected to the input clock signal connection;
    a digitally-controlled delay line receiving an output of the down-sampling circuit;
    an injection pulser receiving an output of the digitally-controlled delay line and connected to provide an injection pulse to a portion of the phase-locked loop (PLL); and
    an injection timing calibration circuit connected to a control input of the digitally-controlled delay line.

2. The PLL circuit of claim 1, wherein the phase-locked loop includes:
    a bang-bang phase frequency detector;
    a digital loop filter connected to a signal output of the bang-bang phase frequency detector;
    a digitally controlled oscillator receiving an output signal of the digital loop filter and the injection pulse from the injection pulser, the digitally controlled oscillator configured to output a resulting clock signal at the output clock signal connection; and
    a divider providing a signal feedback from an output of the digitally controlled oscillator to the bang-bang phase frequency detector.

3. The PLL circuit of claim 2, further comprising a bandwidth optimization circuit connected to the signal output of the bang-bang phase frequency detector.

4. The PLL circuit of claim 3, wherein the bandwidth optimization circuit includes a plurality of flip flop stages connected in series and, for each of the plurality of flip flop stages, a multiplier connected to the output of the corresponding flip flop stage and the signal output of the bang-bang phase frequency detector.

5. The PLL circuit of claim 3, wherein the bandwidth optimization circuit further includes an integrator connected to outputs of the one bit multipliers, wherein the bandwidth optimization circuit includes at least one output electrically connected to the digital loop filter and the injection timing calibration circuit.

6. The PLL circuit of claim 2, wherein the injection timing calibration circuit is connected to the signal output of the bang-bang phase frequency detector.

7. The PLL circuit of claim 1, wherein the down-sampling circuit is configured to down-sample the input clock signal according to a predetermined constant, wherein the predetermined constant is greater than 1.

8. The PLL circuit of claim 1, wherein the phase-locked loop comprises a digital bang-bang phase-locked loop.

9. A method of reducing jitter in a phase-locked loop, the method comprising:
    receiving a clock signal at a phase-locked loop and a down-sampling circuit;
    based on a sign of the clock signal captured by a phase frequency detector included in the phase-locked loop, calibrating an injection signal timing and enabling output of the down-sampling circuit;
    providing an injection signal to a digitally-controlled oscillator included in the phase-locked loop based at least in part on output of an injection pulser receiving an output of a digitally-controlled delay line, the digitally controlled delay line controlled by the calibrated injection signal timing to apply a variable delay to an output from the down-sampling circuit; and
    outputting a clock signal from the digitally-controlled oscillator based at least in part on the output signal received from the injection pulser.

10. The method of claim 9, wherein outputting the clock signal from the digitally-controlled oscillator is further based on an output of a digital line filter connected between the phase frequency detector and the digitally-controlled oscillator.

11. The method of claim 9, further comprising adjusting operation of the digital line filter via a bandwidth optimization circuit.

12. The method of claim 9, further comprising providing an injection signal from a divider connected to a control input of the phase frequency detector.

13. An injection-locked digital bang-bang phase-locked loop (PLL) circuit comprising:
    a digital bang-bang phase-locked loop (PLL) electrically connected to an input clock signal connection and an output clock signal connection, the digital bang-bang PLL comprising:
        a bang-bang phase frequency detector;
        a digital loop filter connected to a signal output of the bang-bang phase frequency detector;
        a digitally controlled oscillator receiving an output signal of the digital loop filter, the digitally controlled oscillator configured to output a resulting clock signal at the output clock signal connection; and a divider providing a signal feedback from an output of the digitally controlled oscillator to the bang-bang phase frequency detector;

a down-sampling circuit connected to the input clock signal connection;

a digitally-controlled delay line receiving an output of the down-sampling circuit;

an injection pulser receiving an output of the digitally-controlled delay line and connected to provide an injection pulse to the digitally controlled oscillator;

an injection timing calibration circuit connected to a control input of the digitally-controlled delay line; and a bandwidth optimization circuit connected to the signal output of the bang-bang phase frequency detector and having a control output connected to the digital loop filter.

14. The injection-locked digital bang-bang phase-locked loop (PLL) circuit of claim 13, wherein the bandwidth optimization circuit includes a plurality of flip flop stages connected in series and, for each of the plurality of flip flop stages, a multiplier connected to the output of the corresponding flip flop stage and the signal output of the bang-bang phase frequency detector.

15. The injection-locked digital bang-bang phase-locked loop (PLL) circuit of claim 13, wherein the down-sampling circuit is configured to down-sample the input clock signal according to a predetermined constant, wherein the predetermined constant is greater than 1.

16. The injection-locked digital bang-bang phase-locked loop (PLL) circuit of claim 13, wherein the divider is configured to provide an injection signal to a control input of the bang-bang phase frequency detector.

17. The injection-locked digital bang-bang phase-locked loop (PLL) circuit of claim 13, wherein the injection timing calibration circuit is connected to the signal output of the bang-bang phase frequency detector.

18. The injection-locked digital bang-bang phase-locked loop (PLL) circuit of claim 13, further comprising a lock detector connected to the signal output of the bang-bang phase frequency detector.

19. The injection-locked digital bang-bang phase-locked loop (PLL) circuit of claim 18, wherein the lock detector is configured to output an enable signal to the down-sampling circuit and the injection timing calibration circuit.

20. The injection-locked digital bang-bang phase-locked loop (PLL) circuit of claim 13, wherein the bandwidth optimization circuit selectively controls the digital line filter and the injection timing calibration circuit based at least in part on the signal output of the bang-bang phase frequency detector.

* * * * *